United States Patent [19]
Tanaka

[11] Patent Number: 4,478,097
[45] Date of Patent: Oct. 23, 1984

[54] PUSHBUTTON TUNER

[75] Inventor: Yoshio Tanaka, Saitama, Japan

[73] Assignee: Clarion Co., Ltd., Tokyo, Japan

[21] Appl. No.: 233,939

[22] Filed: Feb. 12, 1981

[30] Foreign Application Priority Data

Feb. 15, 1980 [JP] Japan .............................. 55-17135[U]
Mar. 6, 1980 [JP] Japan .................................. 55-27326

[51] Int. Cl.³ .......................... H03J 5/12; G05G 1/02
[52] U.S. Cl. ........................................ 74/10.33; 334/7
[58] Field of Search ............................ 74/10.33; 334/7

[56] References Cited

U.S. PATENT DOCUMENTS 4,279,170 7/1981 Righi et al. ......................... 74/10.33
4,331,038 5/1982 Naoi ................................... 74/10.33

Primary Examiner—Allan D. Herrmann
Attorney, Agent, or Firm—Wallenstein, Wagner, Hattis, Strampel & Aubel

[57] ABSTRACT

A pushbutton tuner wherein a setting plate having a guide slot is fitted in an opening formed on a chassis and adapted to be rotated or fixed by a slide plate interlocked with a button slide, a link having a guide opening is rotatably fitted on the setting plate and a setting arm pivotally connected to the button slide is engaged with the guide slot of the setting plate and the guide opening of the link, the link being operable to displace a memory slide.

7 Claims, 15 Drawing Figures

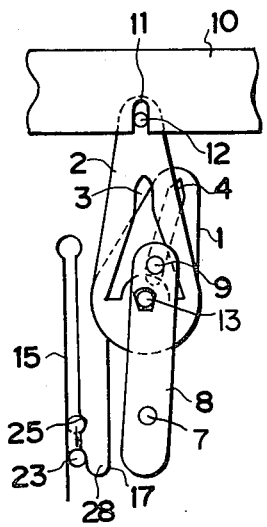
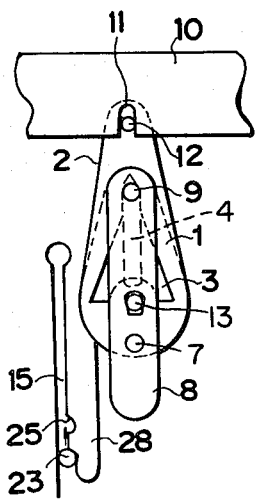
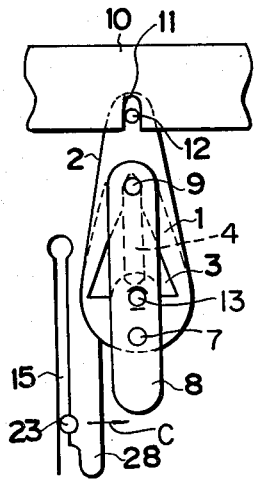
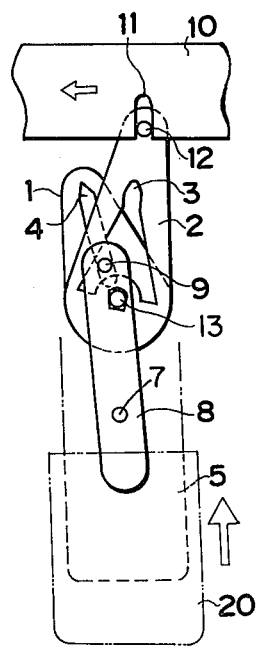
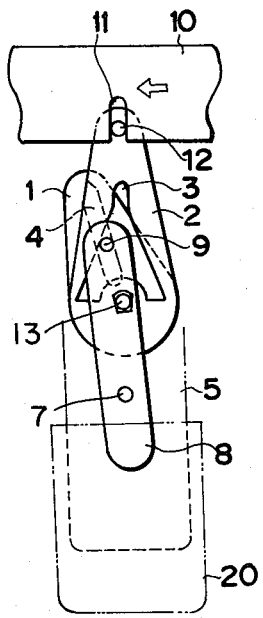
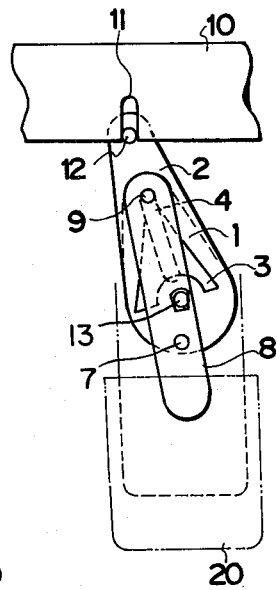

PUSHBUTTON TUNER

BACKGROUND OF THE INVENTION

1. Field of the Invention

This invention relates to a pushbutton tuner, and more particularly to an improvement in the pushbutton tuner for reducing the thickness of the tuner.

2. Description of the Prior Art

A conventional pushbutton tuner suitably adapted for a thinner construction has, for example, a button slide structure as illustrated in FIG. 1. In the figure, A is a button slide, P is a push button, S is a setting plate, B is a leaf-spring and C is a slide plate. This structure has a height or thickness corresponding at least to a space H which is needed for the slide plate C and the leaf-spring B to hold the setting plate S. For this reason, the pushbutton tuner of this type can never be thinner than the space H.

In addition, since the setting plate S is held on a face of the button slide to be set in a position (corresponding to a setting frequency of the tuner) for controlling a core stroke, a frequency deviation from the desired frequency is likely to be caused by a guide operation of the button slide. For this reason, strict manufacturing accuracy is required.

SUMMARY OF THE INVENTION

It is therefore an object of the present invention to provide a pushbutton tuner capable of obviating the defects of the conventional button slide structure.

In accordance with the present invention, there is provided a pushbutton tuner comprising:
button slide members each provided with a push button;
memory slides each adapted to be set in a position corresponding to a desired tuning frequency by a manual tuning operation;
setting members each having a guide slot;
a chassis having openings each for rotatably receiving the respective setting member;
link members each engageable with said memory slide;
setting arm members each pivotally connected to the respective button slide and engageable with the guide opening of the link member and the guide slot of the setting member; and slide members each interlocked with the respective button slide for releasably locking said setting member.

BRIEF DESCRIPTION OF THE DRAWINGS

FIGS. 3A to 3C are explanatory views of a presetting operation of the embodiment illustrated in FIGS. 2A to 2C;

FIGS. 4A to 4C are explanatory views of a pushbutton operation of the embodiment illustrated in FIGS. 2A to 2C;

DETAILED DESCRIPTION OF THE EMBODIMENTS

Figure 1:
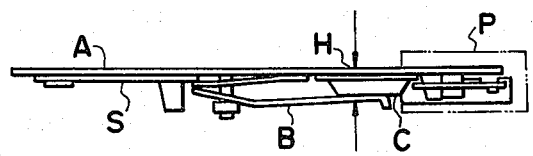
FIG. 1 is a schematic view of a button slide mechanism in a conventional pushbutton tuner.
Figure 2A:
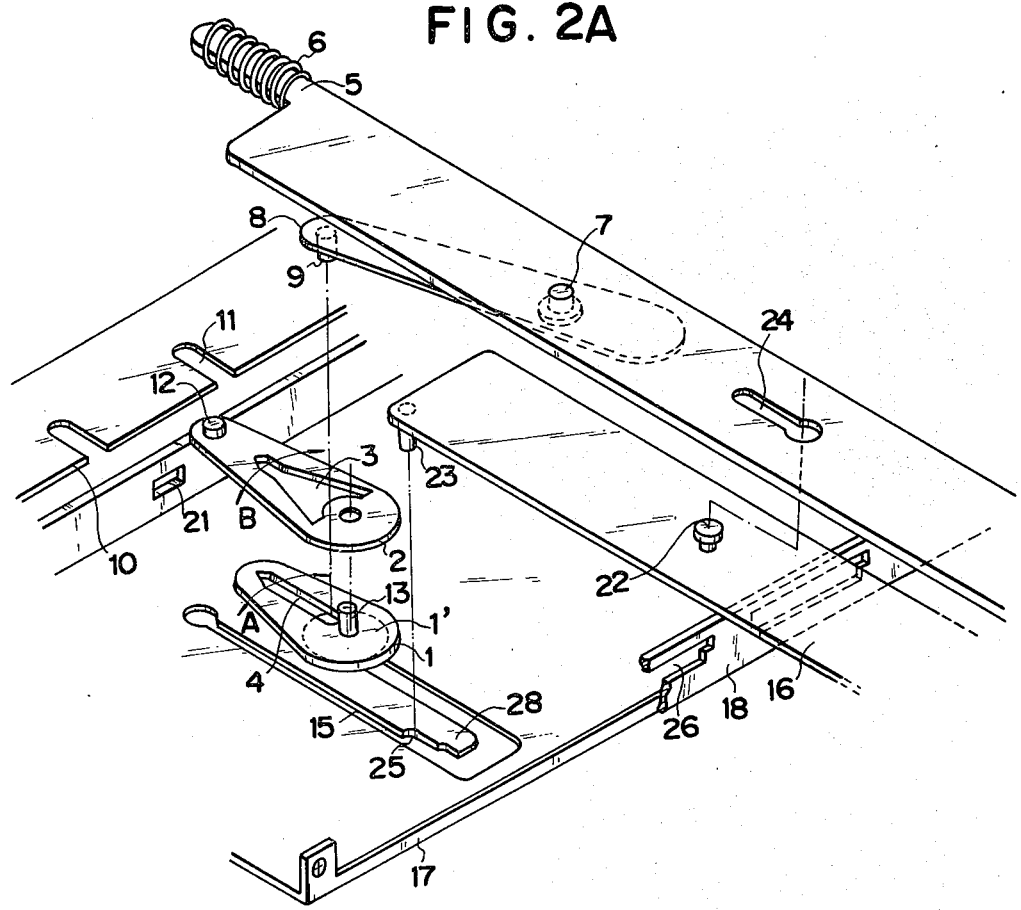
FIGS. 2A to 2C are perspective views of one embodiment of the present invention.

The invention will be described in connection with the embodiments illustrated in the drawings. In FIG. 2A, 1 is a setting plate, 2A is a link, 3 is a guide opening, 4 is a guide slot, 5 is a button slide, 6 is a spring, 7 is a pin, 8 is a setting arm, 9 is a setting pin, 10 is a memory slide, 11 is a guide slot of the memory slide 10, 12 is a memory-pin, 13 is a pin, 14 is an opening, 15 is a lock-slot, 16 is a slide plate, 17 is a chassis, 18 is a front panel, 19 is a knock-pin, 20 is a push button, 21 is a guide aperture, 22 is an engaging pin, 23 is a lock-pin, 24 is an engaging aperture and 25 is a recess.

Figure 2B:
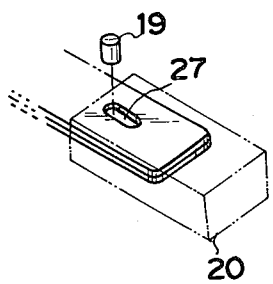
Figure 2C:
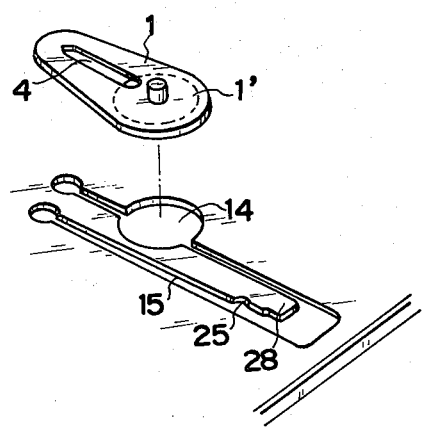

The chassis 17 is formed with the opening 14 and the lock-slot 15 as illustrated in FIGS. 2A and 2C. The setting plate 1 having the guide slot 4 is provided with a cylindrical portion 1' which is fitted in the opening 14 to allow the setting plate 1 to rotate in directions indicated by an arrow A.

The link 2 having the guide opening 3 is loosely fitted around the pin 13 of the setting plate 1 so that it may rotate on the upper face of the setting plate 1 in directions indicated by an arrow B. The link 2 has, at the rear end portion thereof, the memory-pin 12 which is adapted to engage with the guide slot 11 of the memory slide 10.

The setting arm 8 is pivotally connected to the button slide 5 through the pin 7. The setting arm 8 has, at the rear end portion thereof, the setting pin 9 which is adapted to be engaged with the guide opening 3 of the link 2 and the guide slot 4 of the setting plate 1.

The rear end of the button slide 5 is fitted with the resetting spring 6 and inserted in the guide aperture 21 of the chassis 17. The engaging aperture 24 of the button slide 5 is engaged with the pin 22 of the slide plate 16 so that the button slide 5 and the slide plate 16 may be inserted into and guided conjointly by an aperture 26 of the front panel 18. The button slide 5 has, at the forward end portion thereof, an aperture 27 which is engageable with the knock pin 19 to fix the push button 20 to the button slide 5. The slide plate 16 has, at the rear end portion thereof, the lock-pin 23 which is adapted to engage with the lock-slot 15 as will be described in detail later to allow rotation and lock of the setting plate 1.

The memory slide 10 is interlocked with a manual tuning operation mechanism and permeability tuning type core slide (not shown) in the same manner as that of the conventional pushbutton tuner. As in the conventional pushbutton tuner, a plurality of button slides and memory means are provided in the pushbutton tuner of the present invention.

The operating method of the mechanism of the present invention is similar to that of the conventional pushbutton tuner. The presetting operation is as illustrated in FIGS. 3A to 3C. As shown in FIG. 3A, when the push button 20 is pulled forwardly, the lock-pin 23 of the slide plate 16 is moved forwardly, disengaging from the recess 25 of the lock slot 15, so that the setting plate 1 is released into a rotatable position from the lock-position. Under these conditions, when the manual tuning operation mechanism is operated, the memory slide 10 is displaced and set in a position corresponding to a desired channel frequency as in the conventional pushbutton tuner.

Then, when the button slide 5 is depressed as shown in FIGS. 3B and 3C, the setting arm 8 is moved along the edge of the guide opening 3 of the link 2. The setting plate 1 is, accordingly, rotated so as to assume the same angular position as that of the link 2. As a result, the guide opening 3 is aligned with the guide slot 4. As illustrated, the guide opening 3 and the guide slot 4 are formed, at the respective rear ends thereof, in V-shape so that they may positively receive the setting pin 9. When the button slide 5 is further pushed inwardly, the slide plate 16 in its lock-out position is moved rearwardly until the lock-pin 23 of the slide plate 16 reaches the recess 25 of the lock-slot 15 on the chassis 1. In this position, the lock-pin 23 presses a lock arm portion 28 in a direction indicated by arrow C, so that the cylindrical portion 1' of the setting plate 1 is fixed by friction with the inner face of the opening 14 and the locking operation is completed.

By the procedure as described above, the desired channel frequency is set from the position of the memory slide 10 by the tuning operation of the manual tuning mechanism as described above and transferred to and stored in the setting plate 1.

The so stored channel frequencies are selected by a pushbutton operation. More specifically, as illustrated in FIGS. 4A to 4C, when the button slide 5 of the button slide memory means for storing desired channel frequencies as described above is pushed rearwardly, the setting pin 9 moves along the edge of the guide slot 4 of the setting plate 1 in the lock-position. At the same time, since the setting pin 9 abuts against the edge of the guide opening 3 formed on the link 2, the link 2 is caused to pivot. As a result, the memory slide 10 is displaced until the link 2 is aligned with the setting plate 1. Thus, the memory slide 10 is set in a position corresponding to the desired channel frequency, completing the pushbutton tuning operation. In the pushbutton tuning operation, the permeability tuning type core slide member is displaced in response to the movement of the memory slide 10 as in the conventional pushbutton tuner.

Figure 5:
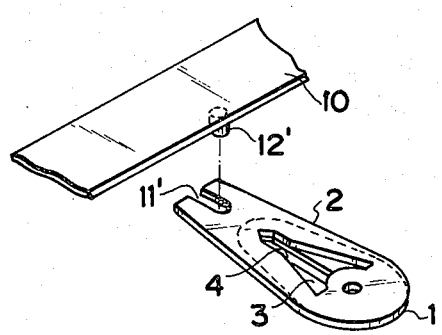
FIGS. 5 and 6 are views of modifications of the embodiment illustrated in FIGS. 2A to 2C.
Figure 6:
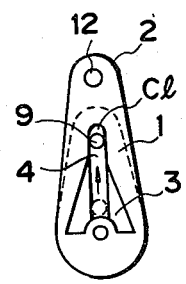

Alternatively, the memory slide 10 may have memory pins 12' and the link 2 may have, at the rear end thereof, the memory slide guide slot 11' as illustrated in FIG. 5. Further, clearances C1 may be provided at the rearmost ends of the guide opening 3 of the link 2 and the guide slot 4 of the setting plate 1, respectively, to avoid application of load to the link 2 at the time of pushbutton operation.

Figure 7A:
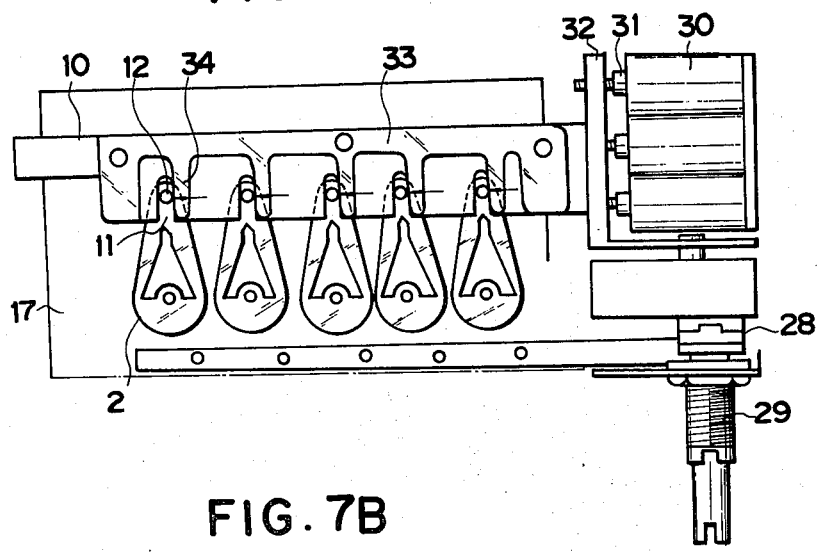
FIGS. 7 (A) and 7 (B) are schematic views of a main portion of another embodiment of the present invention.
Figure 7B:
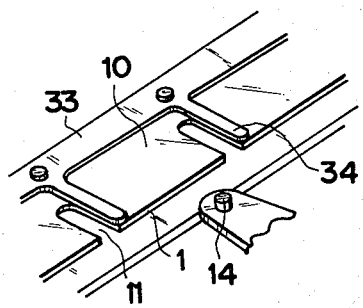
Figure 8:
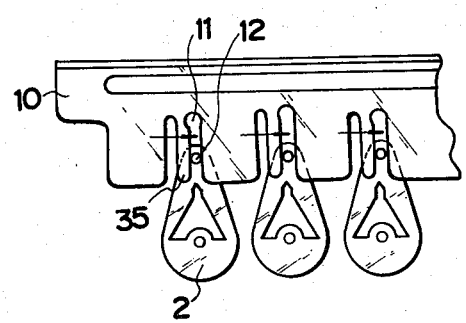
FIG. 8 is a schematic view of a main portion of a further embodiment of the present invention.

FIGS. 7 and 8 illustrate further embodiments of the present invention. In FIGS. 7A and 7B, 28 is a known clutch mechanism, 29 is a manual tuning operation shaft, 30 is a coil, 31 is a core, 32 is a core slide and 33 is a regulating plate. The button slide memory mechanism of this embodiment is substantially the same as that in FIG. 2 except for the known clutch mechanism.

This memory slide 10 is adapted to be guided by a guide pin or a guide portion bent from the chassis 17. According to the present invention, the regulating plate 33 is laid over the memory slide 10. This regulating plate 33 is made of a resilient member and adapted to press, with projections 34, the sides of the memory pins 12 engaged with the guide slots 11, respectively.

Since the memory pin 12 is pressed by the regulating plate 33 in a direction indicated by an arrow mark, undesired play caused at the time of operation of the button slide and occurance of frequency deviation may be prevented effectively.

Instead of making the regulating plate of resilient member, the memory slide 10 may be formed in a manner as illustrated in FIG. 8. More specifically, the memory slide 10 is formed from a resilient member and slots 35 are formed near the respective guide slots 11. When the memory pin 12 is engaged with the guide slot 11, the memory pins 12 are resiliently pressed thereby.

As apparent from the foregoing description, according to the present invention, the setting plate can be set in a position on the chassis as contrasted with the conventional pushbutton tuner wherein the setting plate is set in a position on the face of the button slide, so that a strict accuracy is not required for the mechanism associated with guiding of the button slide. This allows reduction in thickness and facilitates mass-production of the tuner. In addition, the frequency tuning error can be correspondingly reduced. Furthermore since the number of parts to be employed is reduced, the cost can be lowered.

I claim:

1. A pushbutton tuner comprising:
   button slide members each provided with a push button;
   memory slides each adapted to be set in a position corresponding to a desired tuning frequency by a manual tuning operation;
   setting members each having a guide slot;
   a chassis having openings each for rotatably receiving the respective setting member;
   link members each engageable with said memory slide;
   setting arm members each pivotally connected to the respective button slide an engageable with the guide opening of the link member and the guide slot of the setting member; and
   slide members each interlocked with the respective button slide for releasably locking said setting member.

2. A pushbutton tuner according to claim 1, which further comprises lock-slots each formed on said chassis at a position sideward relative to said opening on the chassis and lock-pins each provided on the respective slide member, said lock pin being engaged with the corresponding lock-slot.

3. A pushbutton tuner according to claim 1, wherein said arm member has a setting pin, said setting pin being engaged with said guide slot of the setting member and said guide opening of the link member, said guide slot and said guide opening having, at the respective rear end portions, clearances where said setting pin does not enter.

4. A pushbutton tuner according to claim 2, wherein said lock-slot has a recess which is adapted to engage with said lock-pin at the time of locking.

5. A pushbutton tuner according to claim 1, which further comprises a regulating member provided on said memory slide member for regulating the engagement between the memory slides and the link member.

6. A pushbutton tuner according to claim 5, wherein said memory slide having guide slots and each of said link members has a memory pin engageable with the respective guide slot, said regulating member applying a force in one direction to the memory pins engaged with the respective guide slots.

7. A pushbutton tuner according to claim 1, wherein said memory slide member has guide slots and each of said link members has a memory pin engageable with the respective guide slot, said memory slide member being formed of a resilient member and having slots each formed near the respective guide slots.

* * * * *